United States Patent
Hwang et al.

(10) Patent No.: US 6,565,655 B2
(45) Date of Patent: May 20, 2003

(54) HIGH VACUUM APPARATUS FOR FABRICATING SEMICONDUCTOR DEVICE AND METHOD FOR FORMING EPITAXIAL LAYER USING THE SAME

(75) Inventors: Chul-Ju Hwang, Seongnam (KR); Sung-Ryul Kim, Suwon (KR); Jae-Kyun Park, Seongnam (KR)

(73) Assignee: Jusung Engineering Co., Ltd. (KR)

( * ) Notice: Subject to any disclaimer, the term of this patent is extended or adjusted under 35 U.S.C. 154(b) by 102 days.

(21) Appl. No.: 09/803,859

(22) Filed: Mar. 12, 2001

(65) Prior Publication Data

US 2001/0051429 A1 Dec. 13, 2001

(30) Foreign Application Priority Data

Mar. 14, 2000 (KR) .......................................... 2000/12755

(51) Int. Cl.⁷ .............................................. C30B 25/14
(52) U.S. Cl. ......................... 117/89; 117/93; 117/102; 117/200; 118/715; 118/716
(58) Field of Search ................. 117/200, 89, 93, 117/102; 118/715, 716

(56) References Cited

U.S. PATENT DOCUMENTS

| | | | | |
|---|---|---|---|---|
| 5,382,419 A | * | 1/1995 | Nagai et al. ................. | 423/348 |
| 5,545,387 A | * | 8/1996 | Keck et al. .................. | 423/348 |
| 6,013,155 A | * | 1/2000 | McMillin et al. .......... | 118/723 I |
| 6,054,375 A | * | 4/2000 | Quick ......................... | 438/535 |

* cited by examiner

Primary Examiner—Robert Kunemund
(74) Attorney, Agent, or Firm—Ostrolenk, Faber, Gerb & Soffen, LLP

(57) ABSTRACT

A high vacuum apparatus for fabricating a semiconductor device includes a reactive chamber provided with an inlet and an outlet for a reactive gas, a susceper installed in the reactive chamber for mounting the semiconductor thereon and a vacuum pump connected with the outlet to make the inside of the reactive chamber to put in a high vacuum state, wherein a gas injector of the reactive gas inlet is directed downward of the semiconductor device so that the initial gas flowing of the reactive gas injected from the reactive gas inlet does not directly pass the upper portion of the semiconductor substrate mounted on the suscepter. Since the reactive gas is prevented from cooling and condensing at the upper surface of the semiconductor substrate, defective proportion of the semiconductor device can be remarkably reduced. In addition, the gas outlet is installed at the portion where the reactive gas is satisfactorily cooled and condensed and the vacuum pump is connected with the gas outlet, so that the cooled and condensed contaminant generating source is quickly removed, and thus the defective proportion of the semiconductor device can be considerably reduced.

7 Claims, 5 Drawing Sheets

VACUUM PUMP

VACUUM PUMP

HIGH VACUUM APPARATUS FOR FABRICATING SEMICONDUCTOR DEVICE AND METHOD FOR FORMING EPITAXIAL LAYER USING THE SAME

BACKGROUND OF THE INVENTION

1. Field of the Invention

The present invention relates to a high vacuum apparatus, and more particularly to a high vacuum apparatus for fabricating a semiconductor device that is capable of preventing contaminant particles from generating due to cooling and condensing of reactive gas. The present invention also relates to a method for growing an epitaxial layer with less contaminant particles.

2. Description of the Background Art

As semiconductor devices get to have a higher function and become more highly integrated, contaminant degree due to contaminant particles directly affects the yield of a product.

Thus, efforts are increasingly made with importance to analyze the cause of generation of the contaminant particles and reduce the contaminant particles. Such efforts are important for the clean room environment and a gas convey system of semiconductor process equipment, and more importantly, it is more critical for equipment for performing processes since more contaminant particles are generated especially therein.

In an effort to solve the problems, according to an experiment on the cause of contaminant particles within a high vacuum reactive chamber for forming an epitaxial thin film by the present inventors, they noted that the position relationship between a gas inlet and a gas outlet has much influence on the generation of contaminant particles.

FIGS. 1A through 1C are sectional views of a high vacuum reactive chamber in accordance with a conventional art.

FIG. 1A is a sectional view of a high vacuum reactive chamber in accordance with a first embodiment of a conventional art.

With reference to FIG. 1, there is shown a reactive chamber 100. A gas inlet 106 is installed at one wall side of the reactive chamber 100, and a gas outlet is formed at the bottom of the reactive chamber 100. The gas outlet is connected with a vacuum pump.

A suscepter 102 is installed in the reactive chamber 100, on which a semiconductor substrate 104 is mounted.

In the apparatus of FIG. 1, when an epitaxial thin film is deposited at the upper surface of the semiconductor substrate 104, the reactive gas supplied into the reactive chamber 100 through the gas inlet 106 forms a gas flowing 100a in the direction parallel to the upper surface of the substrate 104 at the upper portion of the substrate 104, and a discharge gas is discharged through the gas outlet provided at the lower center portion of the reactive chamber 100 to communicate with the vacuum pump (not shown).

FIG. 1B illustrates an inspection result according to observation of contaminant particles of the semiconductor substrate processed in the reactive chamber of FIG. 1A.

With reference to FIG. 1B, there are observed short band-shaped particles 105 in the same direction as the gas flowing 100a on the substrate 104.

FIG. 1C illustrates the result of measurement of the number of contaminant particles for the semiconductor substrate of FIG. 1B.

As shown in FIG. 1C, the number of contaminant particles is shown by regions. It is noted that the more distance from where the substrate 104 initially contacts the gas flowing 100a becomes, the more the contaminant particles. That is, the region 107a includes the most contaminant particles in number, the region 107b has the middle number of contaminant particles, and the region 107c has the least contaminant particles.

In other words, the region 107c nearest to the gas inlet has the lowest contamination level while the region 107a farthest to the gas inlet has the highest contamination level. The reason for this is judged that the reactive gas is dispersed from the gas inlet, collides with the inner wall of the opposite reactive chamber, cooled and condensed to generate the contaminant particles.

FIGS. 2A through 2C are diagrams for explaining generation of contaminant particles in the high vacuum reactive chamber in accordance with the second embodiment of the conventional art.

FIG. 2 is a sectional view of a high vacuum reactive chamber 200 in accordance with a second embodiment of the conventional art.

With reference to FIG. 2A, a reactive chamber 200 is shown. A gas inlet 206 is formed at the ceiling of the reactive chamber 200 and a gas outlet is installed at the bottom of the reactive chamber 200, to which a vacuum pump is connected.

A suscepter 202 is installed at the central portion in the chamber 200, on which a semiconductor substrate 204 is mounted.

When an epitaxial layer is deposited at the upper surface of the semiconductor substrate 204 by using the apparatus of FIG. 2A, the reactive gas is supplied through the gas inlet 206 installed at the center of the ceiling of the chamber 200 to the reactive chamber 200, forming the gas flowing 200a in the direction in which the gas collides with the center of the semiconductor substrate 204. A discharge gas is discharged through the gas outlet provided at the center of the bottom of the reactive chamber 200 to communicate with a vacuum pump (not shown).

FIG. 2B is a diagram showing a result of inspection with naked eye of the contaminant particles of the semiconductor substrate which has undergone the processes in the reactive chamber of FIG. 2A.

With reference to FIG. 2B, as the gas flowing 200a collides with the substrate 204, a collision form of pattern 205 was observed around the center of the substrate 204.

FIG. 2C is a diagram showing a result of measurement of the number of the contaminant particles of the semiconductor substrate of FIG. 2B. FIG. 2C also shows the number of contaminant particles by regions, of which, notably, the region 207a where the substrate 204 first collides with the gas flowing 200a includes many contaminant particles, whereas less contaminant particles were observed in the region 207b, which is distant from the region 207a.

This result shows somewhat different from that of FIG. 1C where the farther the reactive gas becomes distance from the gas inlet, the more contaminant particles are generated. The reason for this is considered that the reactive gas is heat-exchanged with the substrate 204 at the portion where the gas flowing 200a directly collides with the substrate 204, cooled and condensed to generate the contaminant particles. Thus, the position where the gas flowing initially collides with inside the reactive chamber 200 is one of principal variants to generate the contaminant particles.

FIGS. 3A through 3C are diagrams showing generation of contaminant particles in the high vacuum reactive chamber in accordance with a third embodiment of the conventional art.

FIG. 3A is a sectional view of a high vacuum reactive chamber in accordance with the third embodiment of the conventional art.

With reference to FIG. 3A, there is shown a reactive chamber 300, in which a susceptor 302 is installed. A semiconductor substrate 304 is mounted at the upper surface of the susceptor 302.

A gas injector 305 is installed at one side spaced apart from the susceptor 302, through which a reactive gas is injected into the reactive chamber 300.

The supplied reactive gas first collides with the wall of the dome-shape ceiling of the reactive chamber 300 or makes a gas flow indicated by a reference numeral 300a due to gravity of itself.

Meanwhile, a discharge gas is discharged through a gas outlet provided at the lower center of the reactive chamber 300, communicating with a vacuum pump (not shown).

FIG. 3B is a result of inspection with a naked eye of the contaminant particles of the semiconductor substrate which has undergone the processes in the reactive chamber of FIG. 3A. It is noted that a circular pattern 305 is widely observed in the portion where the gas flowing 300a contacts the substrate 304.

FIG. 3C is a diagram of a result of measurement of the number of the contaminant particles of the semiconductor substrate of FIG. 3B. Like the result of FIG. 1C, the farther the substrate 304 first contacts the gas flowing 300a, the more contaminant particles the region 307a has. The reason for this is also considered that the gas flowing 300a does not directly collide with the substrate 304 and as the gas flowing 300a becomes distant, it is more easily cooled and condensed to serve as the contaminant particles.

SUMMARY OF THE INVENTION

Therefore, an object of the present invention is to provide a high vacuum apparatus for fabricating a semiconductor device that is capable of preventing contaminant particles from generating due to the cooling and condensing of a reactive gas.

Another object of the present invention is to provide a method for growing an epitaxial layer with less contaminant particles by using the high vacuum apparatus.

To achieve these and other advantages and in accordance with the purpose of the present invention, as embodied and broadly described herein, there is provided an improved high vacuum apparatus for fabricating a semiconductor device including a reactive chamber provided with an inlet and an outlet for a reactive gas, a susceptor installed in the reactive chamber for mounting the semiconductor thereon and a vacuum pump connected with the outlet to make the inside of the reactive chamber to put in a high vacuum state, wherein a gas injector of the reactive gas inlet is directed downward of the semiconductor device so that the initial gas flowing of the reactive gas injected from the reactive gas inlet does not directly pass the upper portion of the semiconductor substrate mounted on the susceptor.

In the high vacuum apparatus for fabricating a semiconductor device of the present invention, the gas outlet is preferably formed at the side wall of the lower portion of the reactive chamber, and more preferably, a gas flow inducing unit for inducing the gas flowing of the reactive gas to the lower portion of the semiconductor substrate is provided at the gas injector.

In the high vacuum apparatus for fabricating a semiconductor device of the present invention, an induction pin inserted in the gas injector may be selected as the gas flow inducing unit. In this case, the induction pin is a hollowed cylinder type with its end portion closed and having a gas injector at the middle portion thereof, and the induction pin is preferably inserted into the gas injector so that gas injector is directed downward of the reactive chamber.

To achieve the above objects, there is also provided a method for forming an epitaxial layer by using the high vacuum apparatus for fabricating a semiconductor device, including the steps of: mounting a semiconductor substrate on the susceptor; operating the vacuum pump so that the pressure within the reactive chamber is in the range of $10^{-9} \sim 10^{-7}$ Torr; maintaining the temperature of the reactive chamber wall at 0~−20° C.; heating the susceptor so that the temperature of the susceptor is maintained at 650~750° C.; and injecting a reactive gas through the gas injector to form an epitaxial layer.

In the method for forming an epitaxial layer of the present invention, if the epitaxial layer is a silicon film, $SiH_4$ or $Si_2H_6$ may be used as a silicon source gas.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
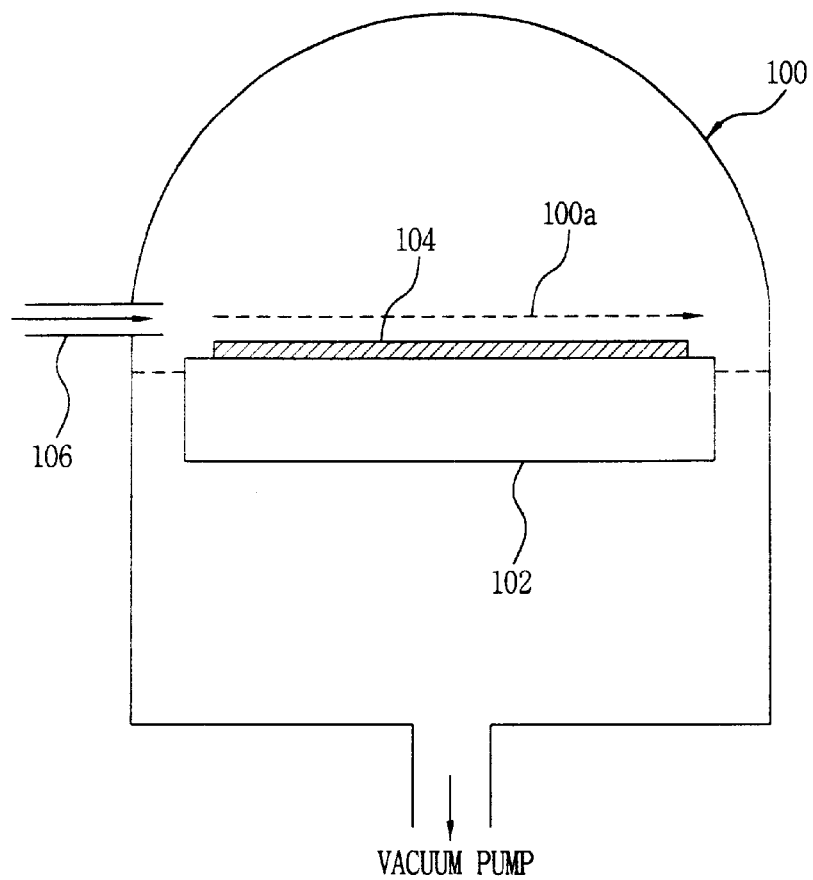
FIG. 1A is a sectional view of a high vacuum reactive chamber in accordance with a first embodiment of a conventional art.
Figure 1B:
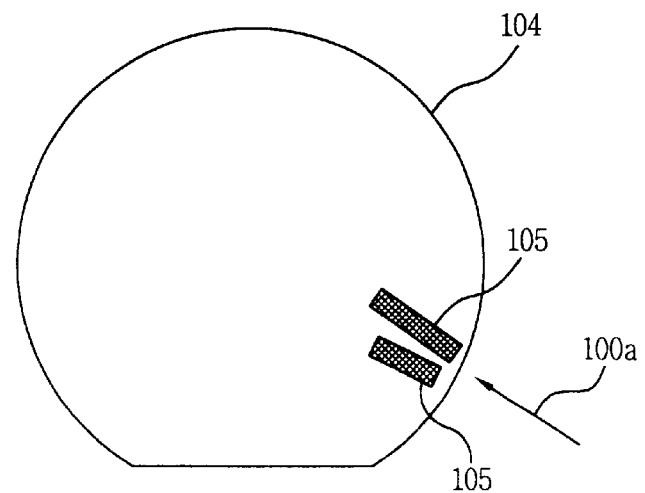
FIGS. 1B and 1C are diagrams for explaining generation of contaminant particles in the process of fabricating a semiconductor using the apparatus of FIG. 1A in accordance with the conventional art.
Figure 1C:
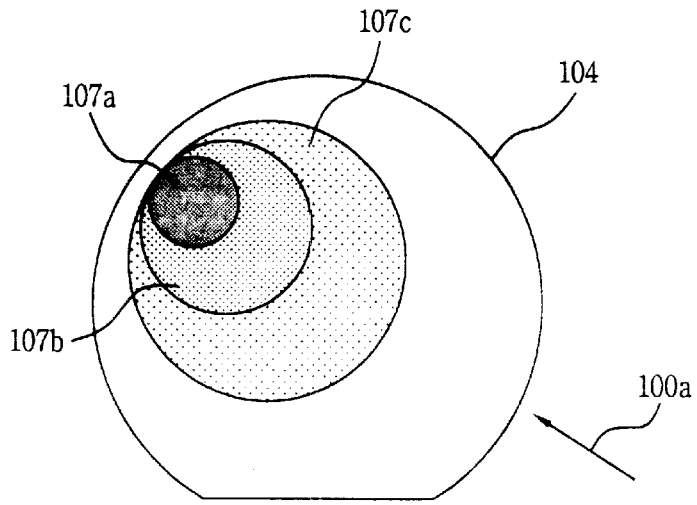
Figure 2A:
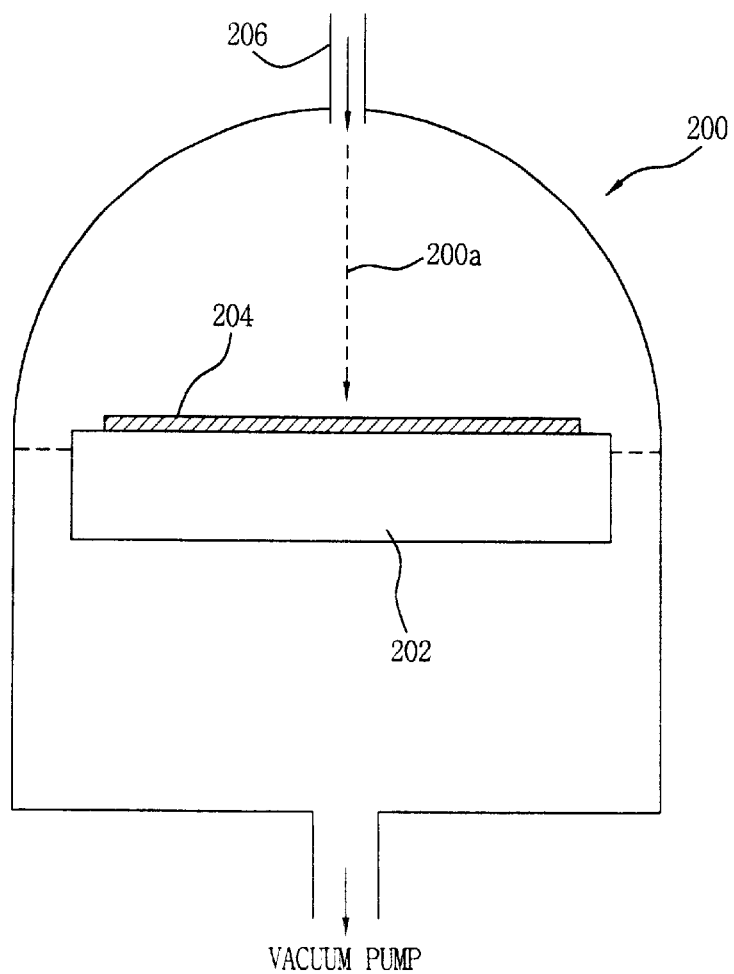
FIG. 2A is a sectional view of a high vacuum reactive chamber in accordance with a second embodiment of a conventional art.
Figure 2B:
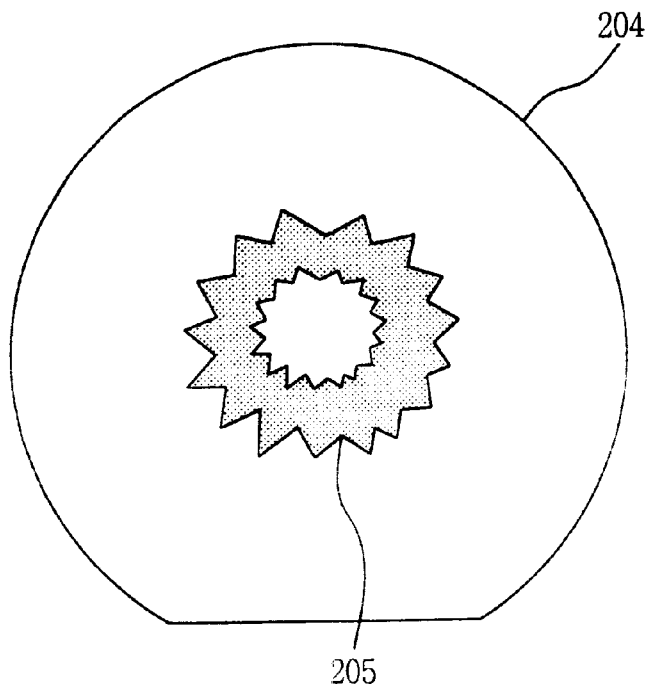
FIGS. 2B and 2C are diagrams for explaining generation of contaminant particles in the process of fabricating a semiconductor using the apparatus of FIG. 2A in accordance with the conventional art.
Figure 2C:
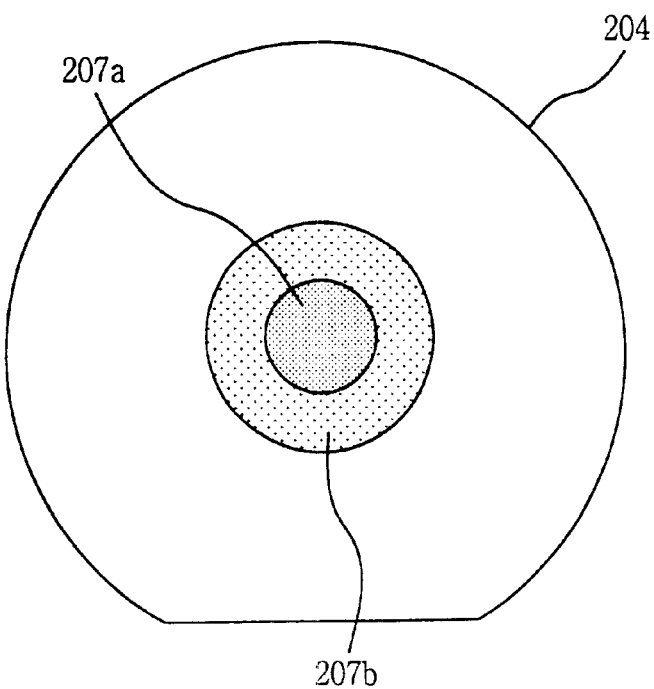
Figure 3A:
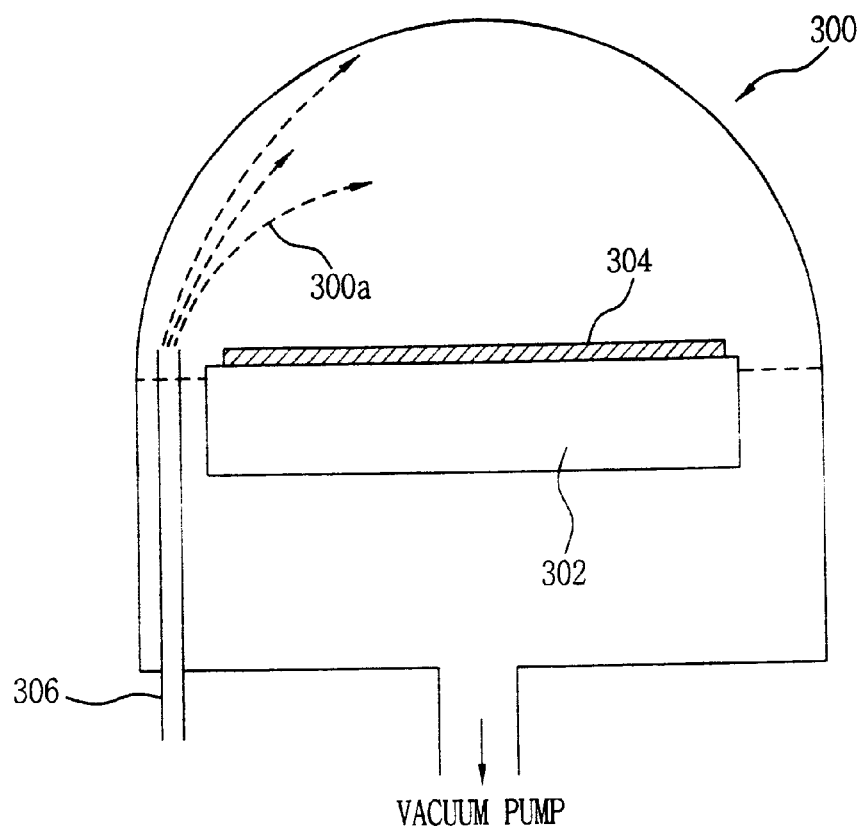
FIG. 3A is a sectional view of a high vacuum reactive chamber in accordance with a third embodiment of a conventional art.
Figure 3B:
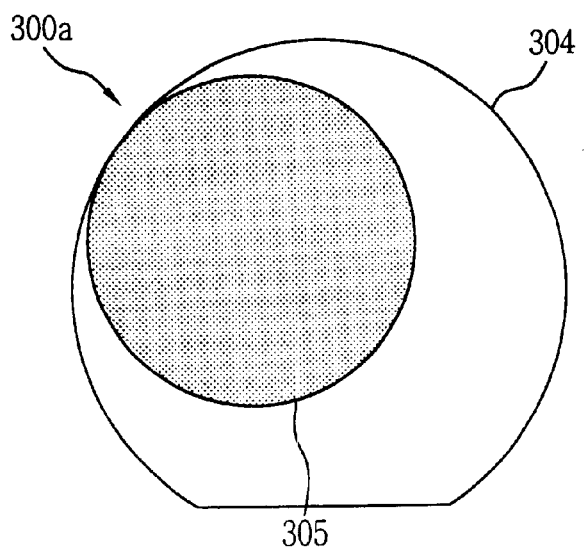
FIGS. 3B and 3C are diagrams for explaining generation of contaminant particles in the process of fabricating a semiconductor using the apparatus of FIG. 3A in accordance with the conventional art.
Figure 3C:
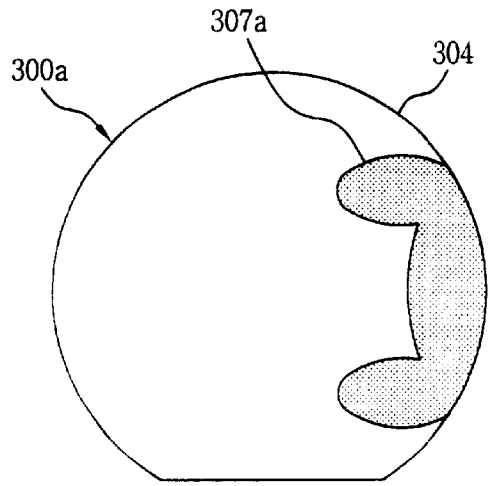
Figure 4A:
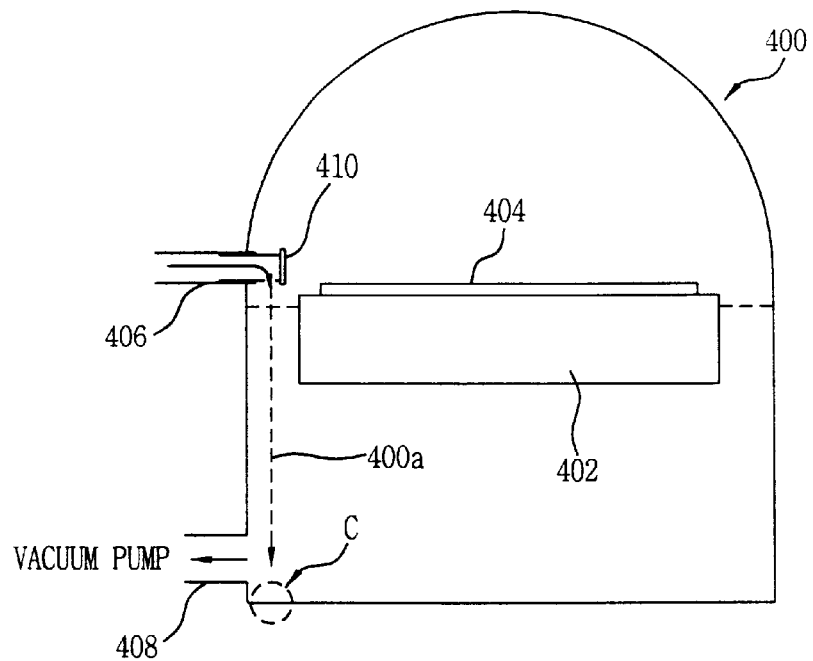
FIG. 4A is a sectional view of a reactive chamber of a high vacuum apparatus for fabricating a semiconductor device in accordance with the present invention.

FIG. 4A is a sectional view of a reactive chamber of a high vacuum apparatus for fabricating a semiconductor device in accordance with the present invention.

As shown in the drawing, a reactive chamber 400 is shown and a suscepter 402 is installed at the central portion inside the reactive chamber 400. A semiconductor substrate 404 is mounted at the upper surface of the suscepter 402.

A gas inlet 406 is formed at the side wall of the reactive chamber 400 at a high position that that of the suscepter 402. A gas outlet 408 is formed at the side wall of the reactive chamber 400 at the lower portion than the suscepter 402.

An induction pin 410 is installed at the end of the gas inlet 406 to induce gas flowing toward the bottom of the reactive chamber 400, thereby preventing the gas flowing from directing to the upper surface of the semiconductor substrate 404.

Figure 4B:
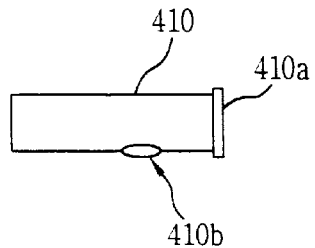
FIG. 4B is a side view of an induction pin used in the high vacuum apparatus for fabricating a semiconductor device in accordance with the present invention.

FIG. 4B is a side view of an induction pin used in the high vacuum apparatus for fabricating a semiconductor device in accordance with the present invention.

The shape and function of the induction pin will now be described in detail.

The induction pin 410 induces gas flowing and is formed in a hollowed cylinder type so as to be inserted into the gas inlet. The end of the induction pin is closed.

A gas injector 410b is formed at the central portion of the cylinder. When the induction pin 410 is inserted into the gas inlet, the gas injector 410b is directed to the bottom of the reactive chamber.

The induction pin 410 is installed in a manner that the gas injector 410b does not come to the position on the upper surface of the semiconductor substrate 404 or the upper surface of the suscepter 402.

That is, the gas inlet 406 formed at the reactive chamber 400 may be formed higher than the position of the suscepter 402, but the gas injector 410b installed at the lower portion of the induction pin 410 is preferred to be positioned not higher than the upper surface of the suscepter 402.

Especially, the gas injector 410b should avoid to be formed at the right upper portion of the suscepter 402 or the semiconductor substrate 404.

The reason for this is that if the gas injector 410b of the induction pin 410 is positioned at the upper surface of the semiconductor substrate 404, the upper surface of the semiconductor substrate is contaminated with the particles.

That is, the induction pin 410 needs to be installed in a manner that the gas injector 410b is positioned between the suscepter 402 and the wall face of the reactive chamber 400.

The induction pin 410 is illustrated in the advancing cylinder type in the FIGS. 4A and 4B. In this respect, however, the gas inlet may be installed around the dome shaped ceiling, not the side wall face. In this case, the induction pin may be bent in various forms.

In other words, the gas injector 410b formed at the induction pin 410 is positioned lower than the upper surface of the suscepter 402 and faces the bottom surface of the chamber, and the induction pin 410 can be variously transformed.

After the induction pin 410 is installed, when reactive gas is injected through the gas inlet 406, the reactive gas is injected in the direction of the gas flowing 400a as shown in the dotted line and initially collides with the 'C' portion of the bottom surface of the reactive chamber 400.

During the fabricating process of the semiconductor device, the temperature of the wall of the reactive chamber 400 is maintained at 0~−20° C., so that a part of the collided gas is cooled and condensed to remain at the 'C' portion, and the other remaining gas rebounds to circulate inside the reactive chamber 400.

Typically, vacuum level of 10-9~10-7 is maintained inside the reactive chamber 400 by a vacuum pump connected with the gas outlet 408, that is, for example, by a turbo molecular pump. Thus, the rebounded gas circulates inside the reactive chamber 400 with a sufficient mean free path.

Accordingly, even though the gas flowing 400a coming out of the gas inlet 406 does not directly pass the upper portion of the semiconductor substrate 104, the processes required for fabricating a semiconductor device can be performed.

In addition, the condensed gas remaining at the 'C' portion of the bottom surface is instantly discharged through the gas outlet 408, so that it does not work as contaminant particles, thereby preventing generation of contaminant particles.

A method for forming a silicon epitaxial layer required for a semiconductor device by using the high vacuum apparatus of FIG. 4 will now be described.

First, a semiconductor substrate is mounted at the upper surface of the suscepter installed in the reactive chamber of the high vacuum apparatus as illustrated in FIG. 4A, for which the vacuum pump is operated so that the pressure in the reactive chamber is 10-8 Torr.

Next, the temperature of the reactive chamber wall is maintained at −10° C. and the temperature of the suscepter is maintained at 700° C., respectively.

Subsequently, Si2H6 gas and Cl2, the reactive gases for forming an epitaxial layer, gas are injected through the gas inlet, to grow a silicon epitaxial layer with less contaminant particles.

As so far described, the high vacuum apparatus for fabricating semiconductor device and method for forming an epitaxial layer using the apparatus has many advantages.

For example, first, the reactive gas is prevented from cooling and condensing at the upper surface of the semiconductor substrate, so that defective proportion of the semiconductor device can be remarkably reduced.

Secondly, the gas outlet is installed at the portion where the reactive gas is satisfactorily cooled and condensed and the vacuum pump is connected with the gas outlet, so that the cooled and condensed contaminant generating source is quickly removed, and thus the defective proportion of the semiconductor device can be considerably reduced.

In the present invention, though the gas flowing is induced by using the induction pin, the gas injector itself may be formed to have a structure having the same shape as the induction pin.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A high vacuum apparatus for fabricating a semiconductor device comprising:

a reactive chamber having an inlet for a reactive gas installed at an upper portion thereof and an outlet for the reactive gas installed at the lower portion thereof;

a suscepter for mounting a substrate installed within the reactive chamber;

a vacuum pump connected to the outlet for creating inside the reactive chamber a high vacuum state; and an induction device adjacent to the inlet to direct a flow of the reactive gas supplied into the reactive chamber from the inlet to the outlet, in a manner where the flow of the reactive gas is substantially directed on a path away from the upper surface of the substrate.

2. The apparatus of claim 1, wherein the induction device has a gas injector.

3. The apparatus of claim 2, wherein the induction device is an induction pin inserted in the gas injector.

4. The apparatus of claim 3, wherein the induction pin is in a hollow cylinder type with its end portion closed, having the gas injector at its middle portion, the gas injector being formed facing the bottom surface of the reactive chamber.

5. The apparatus of claim 4, wherein the gas inlet is installed at the upper end of the side of the reactive chamber.

6. A method for forming an epitaxial layer by using a high vacuum apparatus for fabricating a semiconductor device, the apparatus including a reactive chamber provided with an inlet and an outlet for reactive gas, a suscepter installed in the reactive chamber for mounting the semiconductor thereon, a vacuum pump connected with the outlet to create inside the reactive chamber a high vacuum state, and an induction device adjacent to the gas inlet for directing a flow of the reactive gas, comprising:

mounting a semiconductor substrate on the suscepter;

operating the vacuum pump so that the pressure within the reactive chamber is in the range of $10-9 \sim 10-7$ Torr;

maintaining the temperature of the reactive chamber wall at $0 \sim -20$ C.;

heating the suscepter so that the temperature of the suscepter is maintained at $650 \sim -750$ C.; and maintaining the induction device in a position that causes the reactive gas to be supplied through the gas inlet to the reactive chamber in a manner where the flow of the reactive gas is led substantially directly from the inlet to the outlet on a path that substantially does not include the upper surface of the substrate.

7. The method of claim 6, wherein the epitaxial layer is a silicon film, and the reactive gas is $SiH_4$ or $Si_2H_6$.

* * * * *